United States Patent [19]

Thomas

[11] Patent Number: 5,266,153
[45] Date of Patent: Nov. 30, 1993

[54] GAS DISTRIBUTION HEAD FOR PLASMA DEPOSITION AND ETCH SYSTEMS

[75] Inventor: Michael E. Thomas, Milpitas, Calif.

[73] Assignee: National Semiconductor Corp., Santa Clara, Calif.

[21] Appl. No.: 899,497

[22] Filed: Jun. 16, 1992

[51] Int. Cl.⁵ .................. B44C 1/22; B08B 3/12; C23C 16/00
[52] U.S. Cl. .................. 156/643; 156/345; 134/1; 118/723 R; 118/50.1
[58] Field of Search .................. 156/643, 646, 345; 134/1; 204/298.34; 118/728, 50.1, 620, 723 R, 723 E, 723 ER

[56] References Cited

U.S. PATENT DOCUMENTS 5,006,192  4/1991  Deguchi .................. 204/298.34 X
5,084,125  1/1992  Aoi .................. 156/345

*Primary Examiner*—William A. Powell
*Attorney, Agent, or Firm*—William H. Murray

[57] ABSTRACT

A gas distribution head for plasma deposition and etch systems includes an electrically conductive casing surrounding a plenum chamber. The casing includes a gas inlet and a gas outlet in the form of apertures through the casing. An electrically conductive electrode is positioned within the casing with respect to the interior surfaces of the casing such that a plasma forms between the electrode and the casing upon application of an electrical potential between them. A reactive gas is injected between the two electrodes which is struck to form a plasma for cleaning the inner surfaces of the plasma chamber of undesirable particulates and residues.

19 Claims, 4 Drawing Sheets

GAS DISTRIBUTION HEAD FOR PLASMA DEPOSITION AND ETCH SYSTEMS

BACKGROUND OF THE INVENTION

The present invention relates to equipment used for chemical vapor deposition (CVD) plasma enhanced chemical vapor deposition (PECVD) and reactive ion etching (RIE), and more particularly to gas distribution heads utilized in such equipment.

Gas distribution heads, or showerheads as they are sometimes known, are utilized in deposition and etching systems such as, for example, plasma enhanced chemical vapor deposition (PECVD) systems and reactive ion etching (RIE) systems. A schematic representation, in cross section, of such a showerhead is shown in FIG. 1. The showerhead, generally designated 100, includes an outer casing 102 which surrounds an internal plenum 104. A plurality of apertures 106 are formed in a gas outlet portion of the casing 102. A silicon substrate 108, used in fabrication of integrated circuits, is placed on a platen 110. The platen 110 is positioned with respect to the showerhead 100 such that the substrate 108 is situated in proximity to the apertures 106 in the gas outlet portion of the casing 102.

In both the deposition and etching processes, a gas or gas mixture flows into the plenum 104 and out of the apertures 106 toward the surface of the substrate 108. The platen 110 is maintained at a predetermined temperature and predetermined electrical potential with respect to the gas distribution head 100. The platen 110 maintains the substrate 108 at a predetermined temperature. The substrate 108, being electrically connected to the platen 110, is also maintained at the same electrical potential as the platen 110 with respect to the gas distribution head 100. This electrical potential is typically a radio frequency (RF) potential applied between the gas distribution head 100 and the platen 110. In a deposition process, for example a PECVD process, silane (SiH$_4$) and oxygen (O$_2$) gases flow into the gas distribution head 100 through the plenum 104 and out of the apertures 106. Because of the temperature at which the wafer is maintained, and the potential difference between the electrode and substrate 108 on the one hand and the gas distribution head 100 on the other hand, the silane and oxygen gases react to form a glass (SiO$_2$) on the surface of the substrate 108.

In an etching process, such as an RIE process for etching a layer of aluminum disposed on the substrate 108 into a pattern of interconnects, a gas, such as chlorine, flows into the gas distribution head 100, through the plenum 104 and out of the apertures 106 toward the substrate 108. The aluminum layer disposed on the substrate is coated with a predetermined pattern of protective resist. The protective resist which remains on the aluminum layer defines the interconnect pattern. The potential difference maintained between the substrate 108 and the casing 102 of the gas distribution head 100 causes the chlorine gas to ionize and react with exposed portions of aluminum on the surface of the substrate 108 (i.e., those portions not covered by the protective resist) to form a volatile material, aluminum chloride (AlCl$_3$), which is carried away leaving the protected aluminum as the unetched remainder. In this case, the chlorine is directionally accelerated into the surface of the wafer to generate an anisotropic etch profile.

In both the above processes, particles are transported or formed in the showerhead which may attach to the inner walls of the casing 102 and/or flow toward the apertures 106. Those particles flowing through the apertures could undesirably mask portions of the surface and cause functional defects on the die in the wafers. Other particles may tend to accumulate and ultimately clog one or more of the apertures. Clogging of the apertures 106 necessitates either replacement of the gas distribution head 100 or its removal and cleaning. Both of these operations are very expensive in terms of time and wafer through put. Therefore, it is desirable to provide an improved gas distribution head which would facilitate the removal of particulates formed within the head, thus reducing the number of wafer defects and preventing the obstruction of apertures in the gas distribution head caused by such particles.

SUMMARY OF THE INVENTION

A gas distribution head for plasma deposition and etch systems comprises an electrically conductive casing surrounding a plenum chamber. The casing includes a gas inlet and a gas outlet, the gas outlet comprising a plurality of apertures through the casing. An electrically conductive electrode is disposed within the casing proximate the interior surfaces of the casing which forms the plenum. The electrode is positioned with respect to the interior surfaces of the casing such that a plasma forms therebetween upon application of an electrical potential between the electrode and the casing. A reactive gas is injected between the two electrodes which is struck to form a plasma and cleans the inner surfaces of the plasma chamber of undesirable particulates and residues.

DETAILED DESCRIPTION

Figure 2:
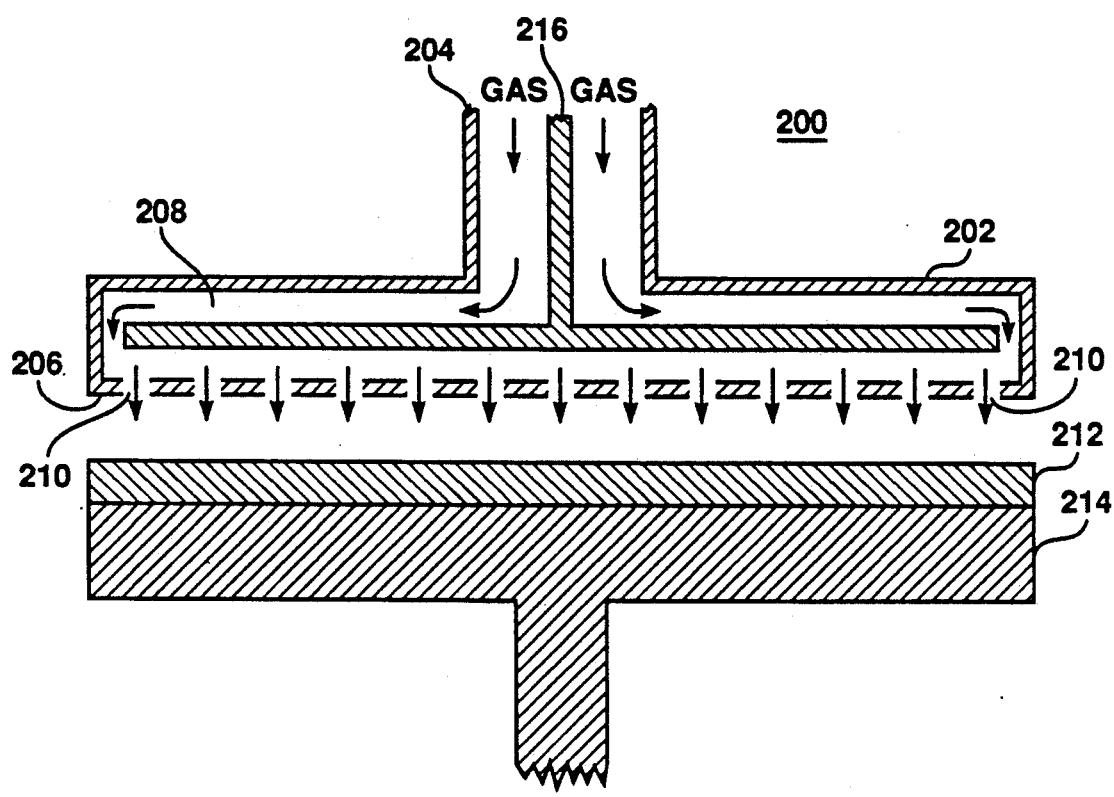
FIG. 2 is a schematic representation, in cross section, of a portion of a gas distribution head in accordance with the present invention.

Referring now to FIG. 2, there is depicted, in cross sectional schematic form, a portion of a gas distribution head in accordance with the present invention generally designated 200. The gas distribution head 200 comprises a casing 202 having a gas inlet portion 204 and a gas outlet portion 206. The inner surfaces of the casing 202 define a gas plenum 208. The gas outlet portion 206 the casing 202 has a plurality of apertures 210 therethrough. The apertures permit gas to flow from the gas plenum 208 toward the surface of a silicon substrate 212 which is positioned on a platen 214. An electrode 216 is disposed within, and electrically isolated from the casing 202. A voltage source (not shown) is connectable between the casing 202 and the electrode 216.

Figure 1:
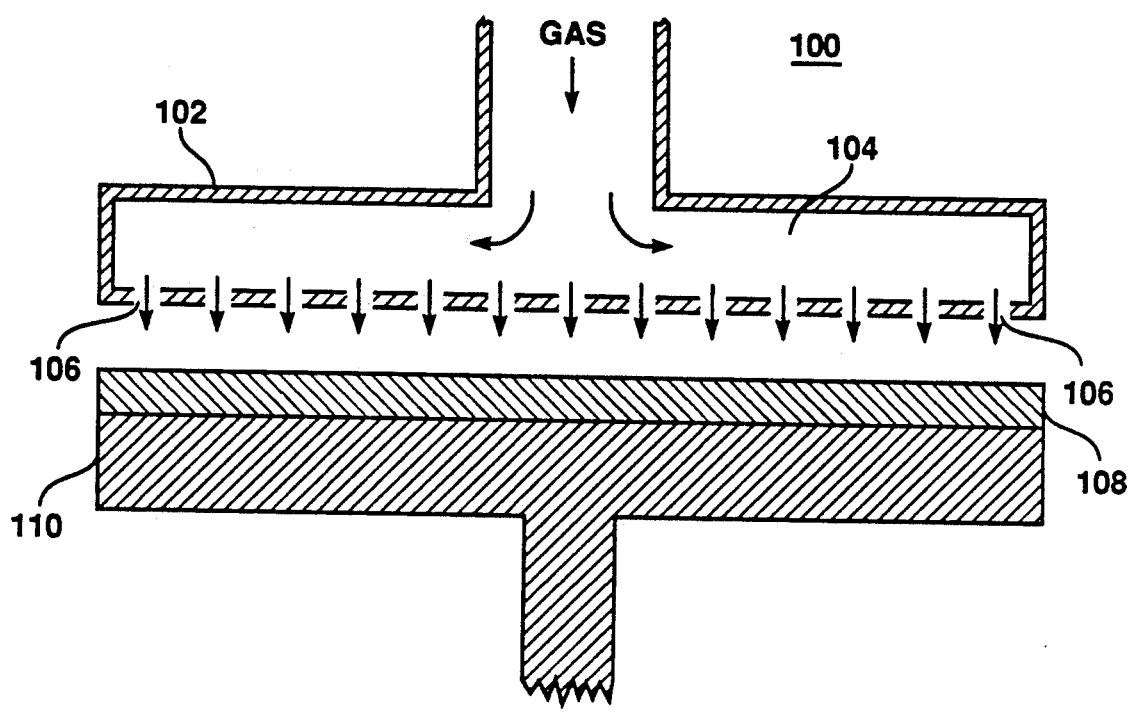
FIG. 1 is a schematic representation, in cross section, of a prior art gas distribution head.

When used in a deposition or etching system, the gas distribution head 200 functions in accordance with prior art gas distribution heads, for example the head 100 depicted in FIG. 1. The gas or gas mixture will flow into the gas inlet portion of the head 200, around the electrode 216 and into the plenum 208. From there it will continue flowing around the electrode 216 and out of the apertures 210 toward the surface of the substrate 212; where, depending upon the gases used, deposition or etching will take place. Periodically, a voltage will be applied between the electrode 216 and the casing 202 to remove the particles from within the plenum 208 and the apertures 210. This is accomplished as follows.

For example in an $SiO_2$ CVD deposition showerhead, a mixture of $CHF_3/O_2$ is placed in a ratio of 5:1 at a pressure of 100 millitorr in the showerhead between the electrode 216 and the casing 202. An RF plasma is struck to remove the particulates of $SiO_2$ by plasma etching. For a CVD tungsten deposition showerhead, a mixture $SF_6$ or $SF_6:Cl_2(5:1)$ is placed into the showerhead at 100 millitorr. A plasma is then ignited as described above in the previous example to etch away the tungsten particulates. The procedure of the first example can also be used to cleanse particulates of $Si_3N_4$ in a CVD $Si_3N_4$ deposition showerhead.

The plasma is struck by, for example, grounding the electrode 216 and setting up a negative DC bias on the casing 202 to etch residue away after adding the reactive gas; then grounding the casing 202 and placing a negative DC bias on the electrode 216 to etch residue away after adding reactive gas.

Figure 3:
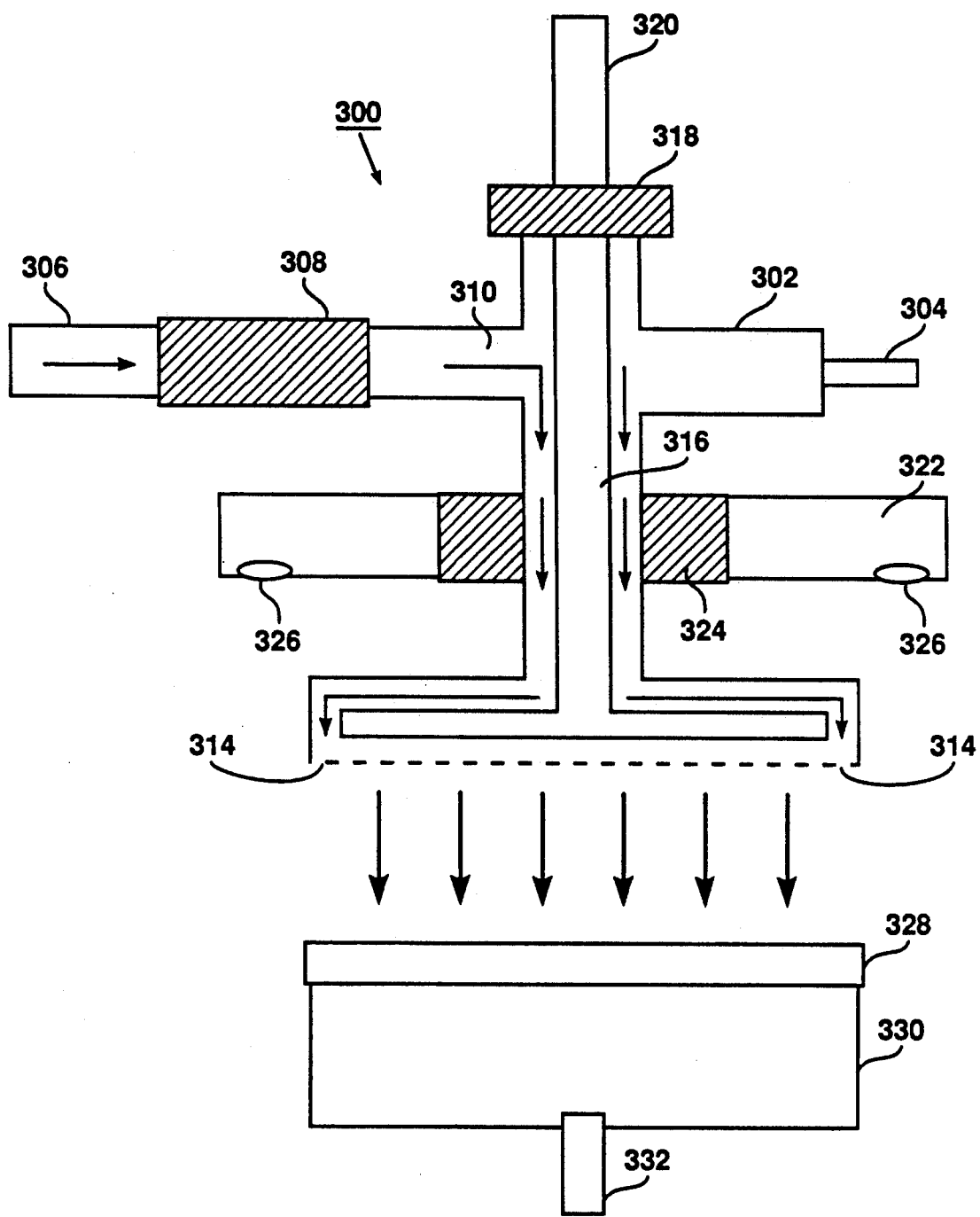
FIG. 3 is a schematic representation, cross section of a gas distribution head in accordance with the present invention.

Referring now to FIG. 3 there is shown, in cross sectional schematic form, a preferred embodiment of the gas distribution head in accordance with the present invention, generally designated 300. The gas distribution head 300 comprises an electrically conductive casing 302 and a first electrode 304 electrically connected to the casing 302. A gas inlet 306 is in fluid communication with the interior of the casing 302 through a first electrical insulator 308. The insulator 308 provides electrical insolation between the gas inlet 306 and the casing 302. The inner surfaces of the casing 302 define a gas plenum 310. The lower portion of the casing 302 has a plurality of apertures 314 formed therein which permit the escape of gas from the plenum 310.

An electrode 316 is disposed within the plenum 310 spaced from the inner walls of the casing 302. A second electrical insulator 318 supports the electrode 316 within the plenum 310 and provides electrical isolation between the electrode 316 and the casing 302. The second electrical insulator 318 also forms a seal between the casing 302 and the electrode 316 to prevent the escape of gases from the plenum 310. A second electrode 320 is electrically connected to the electrode 316.

The casing 302 is attached to a lid 322 which is removably attached to a vacuum chamber (not shown). A third electrical insulator 324 forms a supporting seal between the lid 322 and the casing 302 and provides electrical isolation between them. An 0 ring seal 326 seals the lid 322 to the vacuum chamber (not shown). A substrate 328 is mounted on and electrically connected to a platen 330. A third electrode 332 is electrically connected to the platen 330.

Figure 4:
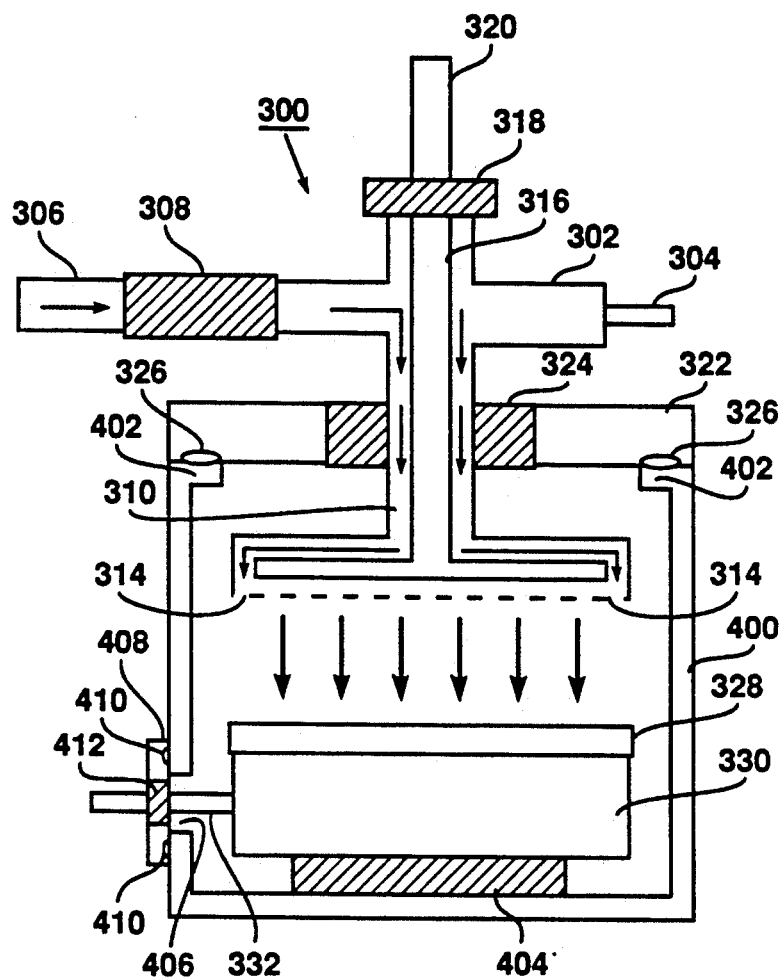
FIG. 4 is a schematic representation, cross section of the gas distribution head depicted in FIG. 3 mounted in a vacuum chamber.

Referring now to FIG. 4, the lid 322, with the gas distribution head 300 attached, is attached to a vacuum chamber 400. The 0 ring seal 326 seals the lid 322 to a top flange 402 of the vacuum chamber 400. The platen 330 is mounted within the chamber 400 preferably by an electrically insulating support 404. In addition to attaching the platen 330 to the interior of the chamber 400, the support 404 provides electrical isolation between the platen 330 and the chamber 400. The third electrode 332 extends through a port 406. The port 406 is sealed by a cover 408. A second 0 ring seal 410 seals the cover 408 to the vacuum chamber 400. The cover 408 includes a fourth electrical insulator 412 which, in addition to forming a seal around the third electrode 332, also provides electrical isolation between the third electrode 322 and the chamber 400.

When used during a deposition or etching process, the first electrode 304 and second electrode 320 are typically electrically connected to ground and an RF potential is applied to the platen 330 by means of the third electrode 332. During the process, the electrode which is being driven by the RF potential is the electrode which typically receives more ion bombardment than the electrode maintained at ground potential due to its difference in area. During the cleaning process performed in accordance with the present invention, either the first electrode 304 or the second electrode 320 ca be maintained at ground while RF potential is applied to either the second electrode 320 or the first electrode 304 respectively.

For example, when it is desired to bombard the case 302 with electrons, the second electrode 320 is maintained at ground potential while RF potential is applied to the first electrode 304. If it is desired to bombard the electrode 316 with ions, the first electrode 304 is maintained at ground potential while RF potential is applied to the second electrode 320. During this cleaning process, the bottom electrode can be either floating or maintained at ground potential.

Ion bombardment of the case 302 aids the chemical attack of foreign particulates on the inner surface of the case 302 and the apertures 314 which are then broken down and carried away through the apertures 314 by the gas flowing through the plenum 310. Similarly, ion bombardment of the electrode 316 is used to break down and remove foreign particles from the surface of the electrode 316 which are then carried away through the apertures 314 by the gas flowing through the plenum 310. In this way, the gas distribution head is cleaned of foreign materials without having to remove it from the chamber as was necessary with prior art distribution heads.

It will be understood that various changes in the details, materials and arrangement of the parts which have been herein described and illustrated in order to explain the nature of this invention, may be made by those skilled in the art within the principle and scope of the invention as expressed in the following claims.

I claim

1. A gas distribution head for plasma deposition and etch systems comprising:
   a. a plenum chamber surrounded by an electrically conductive casing;
   b. a gas inlet to said plenum chamber;
   c. a gas outlet from said plenum chamber; and
   d. an electrically conductive electrode disposed within said plenum chamber.

2. A gas distribution head in accordance with claim 1 wherein said gas outlet comprises a plurality of apertures.

3. A gas distribution head in accordance with claim 1 additionally comprising a voltage source connected between said casing and said electrode.

4. A gas distribution head in accordance with claim 3 additionally comprising means for switching the polarity of the voltage source connected between said conductive casing and said electrode.

5. A method of cleaning a gas distribution head for plasma deposition and etch systems comprising the steps of:
   a. providing a plenum chamber surrounded by an electrically conductive casing including a gas inlet and a gas outlet;
   b. disposing an electrically conductive electrode within said casing;
   c. introducing a gas through said gas inlet into said plenum chamber between said casing and said electrode; and
   d. striking a plasma between said plenum chamber casing and said electrode.

6. The method in accordance with claim 5 wherein step d comprises applying a voltage between said electrically conductive electrode and said electrically conductive casing.

7. The method in accordance with claim 6 wherein step d comprises the step of applying a negative dc bias to said electrically conductive casing.

8. The method in accordance with claim 6 wherein step d additionally comprises the step of applying a negative dc bias to said electrically conductive electrode.

9. The method in accordance with claim 5 wherein step d comprises the step of applying an RF voltage between said electrically conductive casing and said electrically conductive electrode.

10. The method in accordance with claim 9 wherein step d additionally comprises maintaining said electrically conductive electrode at ground potential while applying said RF voltage to said electrically conductive casing.

11. The method in accordance with claim 9 wherein step d additionally comprises maintaining said electrically conductive casing at ground potential while applying said RF voltage to said electrically conductive electrode.

12. A plasma deposition and etch system comprising:
   a. a vacuum chamber; and
   b. a gas distribution head at least partially disposed within said vacuum chamber, said gas distribution head comprising:
      1) a plenum chamber surrounded by an electrically conductive casing;
      2) a gas inlet to said plenum chamber;
      3) a gas outlet from said plenum chamber; and
      4) an electrode disposed within said plenum chamber.

13. A plasma deposition and etch system in accordance with claim 12 wherein said plenum chamber is disposed through a removable lid portion of said vacuum chamber.

14. A plasma deposition and etch system in accordance with claim 13 additionally comprising a voltage source connected between said casing and said electrode of said gas distribution head.

15. A plasma deposition and etch system in accordance with claim 14 additionally comprising means for switching the polarity of the voltage source connected between said conductive casing and said electrode.

16. A plasma deposition and etch system in accordance with claim 15 additionally comprising a platen disposed within said vacuum chamber.

17. A plasma deposition and etch system in accordance with claim 16 wherein said gas outlet from said plenum chamber is disposed within said vacuum chamber in spaced relation to said platen.

18. A plasma deposition and etch system in accordance with claim 17 wherein said gas outlet comprises a plurality of apertures in said plasma chamber proximate said platen.

19. A plasma deposition and etch system in accordance with claim 18 additionally comprising means for applying a radio frequency (RF) potential between said platen and said plenum chamber.

* * * * *